United States Patent
Ishizaka et al.

(10) Patent No.: US 7,312,501 B2
(45) Date of Patent: *Dec. 25, 2007

(54) SEMICONDUCTOR DEVICE

(75) Inventors: Katuo Ishizaka, Shinto (JP); Tetsuo Iijima, Maebashi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/030,094

(22) Filed: Jan. 7, 2005

(65) Prior Publication Data

US 2005/0151186 A1    Jul. 14, 2005

Related U.S. Application Data

(63) Continuation of application No. 10/641,163, filed on Aug. 15, 2003, now Pat. No. 6,847,058.

(30) Foreign Application Priority Data

Sep. 12, 2002    (JP) .............................. 2002-266868

(51) Int. Cl.
*H01L 29/76* (2006.01)
*H01L 29/94* (2006.01)
*H01L 31/00* (2006.01)

(52) U.S. Cl. ............... 257/341; 257/329; 257/E21.409; 257/E21.615

(58) Field of Classification Search ................ 257/328, 257/329, 341, E21.409, E21.615
See application file for complete search history.

(56) References Cited

U.S. PATENT DOCUMENTS

| | | | |
|---|---|---|---|
| 3,919,007 A | 11/1975 | Tarui et al. ................. | 438/268 |
| 3,950,777 A | 4/1976 | Tarui et al. ................. | 257/330 |
| 4,580,154 A | 4/1986 | Coe ............................ | 257/342 |
| 4,641,162 A | 2/1987 | Yilmaz ...................... | 357/23.4 |
| 4,801,986 A | 1/1989 | Chang et al. ............... | 257/139 |
| 5,086,323 A | 2/1992 | Nakagawa et al. ......... | 257/394 |
| 5,093,701 A | 3/1992 | Nakagawa et al. ......... | 257/341 |
| 5,111,253 A | 5/1992 | Korman et al. ............. | 257/341 |
| 5,304,832 A * | 4/1994 | Takahashi ................... | 257/342 |
| 6,069,386 A | 5/2000 | Jos ............................. | 257/339 |
| 6,133,099 A * | 10/2000 | Sawada ...................... | 438/270 |
| 6,441,432 B1 | 8/2002 | Sumida ...................... | 257/339 |
| 6,445,036 B1 * | 9/2002 | Maruoka .................... | 257/330 |
| 6,452,222 B1 | 9/2002 | Itoh ........................... | 257/288 |
| 2002/0060339 A1 * | 5/2002 | Maruoka .................... | 257/330 |

FOREIGN PATENT DOCUMENTS

JP    63-289871    11/1988

* cited by examiner

*Primary Examiner*—George R. Fourson
*Assistant Examiner*—John M. Parker
(74) *Attorney, Agent, or Firm*—Miles & Stockbridge P.C.

(57) ABSTRACT

ON resistance and leakage current of a vertical power MOSFET are to be diminished. In a vertical high breakdown voltage MOSFET with unit MOSFETs (cells) arranged longitudinally and transversely over a main surface of a semiconductor substrate, the cells are made quadrangular in shape, and in each of the cells, source regions whose inner end portions are exposed to the interior of a quadrangular source contact hole are arranged separately and correspondingly to each side of the quadrangle. Each source region is trapezoidal in shape, and a lower side of the trapezoid is positioned below a gate electrode (gate insulating film), while an upper side portion of the trapezoid is exposed to the interior of the source contact hole. The four source regions are separated from one another by diagonal regions of the quadrangle.

14 Claims, 7 Drawing Sheets

A—A'

B—B'

SEMICONDUCTOR DEVICE

CROSS-REFERENCE TO RELATED APPLICATION

This application is a continuation of application Ser. No. 10/641,163 filed Aug. 15, 2003 now U.S Pat. No. 6,847,058.

BACKGROUND OF THE INVENTION

The present invention relates to a technique applicable effectively to a semiconductor device, e.g., a vertical high breakdown voltage MOSFET (Metal Oxide Semiconductor Field Effect Transistor) which permits ON resistance to be made small and permits reduction of a device area.

A vertical high breakdown voltage MOSFET, i.e., a power MOSFET, has various characteristics such as being superior in frequency characteristic, high in switching speed and capable of being driven at a low power. For this reason the MOSFET in question is used in various industrial fields.

For increasing output, the power MOSFET adopts a structure wherein a large number of unit MOSFETs (cells) are arrayed over a main surface of a semiconductor substrate. Examples of cell shapes include quadrangular, hexagonal, and circular shapes. In the case of circular or hexagonal cells, there is adopted a so-called triangular array in which three adjacent cells are centered respectively on vertices of a triangle. In the case of quadrangular cells, there is adopted a so-called quadrangular array in which four adjacent cells are centered respectively on vertices of a quadrangle. Also in the case of quadrangular cells it is possible to adopt a triangular array.

In the case of circular or hexagonal cells arranged in a triangular array, if depletion layers are created by increasing voltage gradually, the potential relaxed by the depletion layers at the center of the triangle in the triangular array becomes higher than the potential related by depletion layers at the center of a quadrangle in a quadrangular array, with consequent occurrence of avalanche breakdown, so that the breakdown voltage cannot be set large in comparison with the quadrangular array. In the present situation, a maximum breakdown voltage of 1500V or so is possible in the case of quadrangular cells in a quadrangular array, but in the case of circular cells in a triangular array, an upper limit is 200V, and in the case of hexagonal cells in a triangular array, an upper limit is 600V or so.

In each unit MOSFET, a source contact hole is quadrangular, hexagonal, or circular in shape, and a source region is formed along a peripheral edge of the source contact hole and inside and outside the hole. Therefore, a planar pattern of the source region is a quadrangular frame pattern in the case of a quadrangular cell, is a hexagonal frame pattern in the case of a hexagonal cell, or is a ring-like pattern in the case of a circular cell.

In forming base and source regions, diffusion is performed using a gate electrode-including portion as a mask for impurity diffusion to determine the depth (spreading length in the planar direction) of the base region and that of the source region. In the case of a quadrangular cell, the spread of impurity at each corner portion becomes radial, so that the impurity concentration at each corner becomes lower than that in impurity diffusion at each side of a quadrangle and hence the threshold voltage becomes lower. Consequently, in the case where a steep current is applied, there occurs a current concentration to a portion where the threshold voltage is low, with eventual breakage of the device. For avoiding this inconvenience there has been proposed a structure in which a source region is not disposed at each corner. That is, there is adopted a rectangular or convex shape wherein a source region is allowed to cross each side of a quadrangle (see, for example, Patent Literatures 1 and 2).

[Patent Literature 1]
Japanese Unexamined Patent Publication
No. Sho 63 (1988)-289871 (page 3, FIGS. 1, 2 and 4)
[Patent Literature 2]
U.S. Pat. No. 4,641,162 (column 6, FIG. 4)

SUMMARY OF THE INVENTION

In a semiconductor device structure having a pn junction such as a power MOSFET, there occurs leakage current due to for example a defect in the bulk or surface, but if the level of the leakage current is bad, there may be an increase of loss in a mounted state for use, or as the case may be, a breakdown potential increases due to concentration of an electric current in a defective portion. Also in the device itself, not only its quality but also the yield thereof is deteriorated with an increase of the leakage current level, thus causing an increase of cost. Thus, it is necessary to make a design so as to minimize the leakage current.

A main cause of leakage current is a defect in the manufacturing stage such as a defect in the bulk or surface, but as design-related factors of leakage current there are such parameters as channel length and impurity concentration of a channel portion. From the standpoint of a relation of the channel length and impurity concentration to leakage current, the easier the inversion of channel surface into a reverse conductive type, the easier the flow of current, so by making the channel length larger or by making the impurity concentration higher, the inversion of the channel surface becomes difficult, thus permitting a decrease of leakage current. But this method gives rise to the problem that ON resistance increases to a great extent, resulting in deterioration of the device performance.

As to designing the channel portion, an impurity concentration of the channel portion is determined by setting a threshold value of the device, and the channel length is restricted by for example a voltage proof design for the prevention of a punch-through phenomenon. Therefore, for decreasing leakage current in the situation where target threshold value and breakdown voltage value are set, it is necessary that the channel length be made larger by prolonging the diffusion time of impurity. However, if the channel length is made larger, the unit cell size of MOSFET becomes larger and ON resistance increases although leakage current is decreased.

FIG. 11 is a schematic diagram showing a state of impurity diffusion at the time of forming a source region in a quadrangular cell.

A mask 51 is formed on a P type base region 50 in a surface layer of an N type semiconductor substrate, and an N+ type source region 53 is formed by diffusing impurity in a quadrangular opening 52. In this case, at side portions of the quadrangle the impurity is diffused uniformly, but at corner portions the impurity is diffused radially. Arrows represent schematically diffusing directions and quantities of the impurity. The region where arrows are described at constant pitches indicates that the impurity is diffused uniformly, while the radial portion indicates that the impurity is dispersed.

Thus, at corner portions of the quadrangular opening 52 the impurity is radially dispersed and diffused, so that the impurity concentration at each corner portion becomes lower than that at each side portion, and the impurity diffusion length becomes shorter. Such a lowering of the impurity concentration results in easier inversion of the channel surface and easier occurrence of leakage current. The occurrence of leakage current causes a power loss.

The above is also true of forming the base region prior to forming the source region. At each corner portion of the base region the impurity concentration is lower than in each side portion and the diffusion length practically becomes shorter than in each side portion. Subsequent formation of the source region results in the channel length becoming shorter and easier occurrence of leakage current.

In Patent Literatures 1 and 2 a source region is formed independently at each side portion of a quadrangle and its pattern is merely made rectangular. This results in that the channel width becomes much shorter and ON resistance increases in comparison with the case where a source region is formed as a quadrangular frame pattern.

It is an object of the present invention to provide a semiconductor device having a vertical high breakdown voltage MOSFET (insulated gate field effect transistor) which permits a decrease of ON resistance.

It is another object of the present invention to provide a semiconductor device having a vertical high breakdown voltage MOSFET which permits a decrease of leakage current and a decrease of ON resistance.

It is a further object of the present invention to provide a semiconductor device having a small-sized, vertical high breakdown voltage MOSFET which permits a decrease of leakage current and a decrease of ON resistance.

The above and other objects and novel features of the present invention will become apparent from the following description and the accompanying drawings.

A typical mode of the invention disclosed herein will be outlined below.

(1) A semiconductor device having a plurality of polygonal (quadrangular) unit MOSFETs (cells) connected in parallel over a main surface of a semiconductor substrate, the semiconductor device comprising:

the semiconductor substrate (silicon substrate) of a first conductive type (N type) serving as a drain;

a MOS gate comprising a gate insulating film ($SiO_2$ film) formed selectively over the main surface of the semiconductor substrate, a gate electrode (polysilicon film) formed over the gate insulating film, and an insulating film ($SiO_2$ film/PSG film) which covers the gate electrode and the gate insulating film;

a source contact hole formed in a region not being covered with the insulating film, of the main surface of the semiconductor substrate;

a base region of a second conductive type (P type) formed over the main surface of the semiconductor substrate, superimposed over the source contact hole and extending to below the MOS gate;

a source region of a first conductive type ($N^+$ type) formed over the main surface of the semiconductor substrate, extending to below the MOS gate from an inside portion of the source contact hole and forming a channel between it and an outer peripheral edge of the base region; and a source electrode formed on the source contact hole and the MOS gate and connected-electrically to the source region and the base region, wherein the gate insulating film, the gate electrode and the insulating film are of a mesh structure for forming the cells over the main surface of the semiconductor substrate, and the regions where the gate insulating film, the gate electrode and the insulating film are not formed are polygonal in shape, the polygons being arranged in a quadrangular array such that centers of four adjacent polygons arranged in order longitudinally and transversely over the main surface of the semiconductor substrate are positioned respectively at vertices of a quadrangle, the source region is not present below the gate electrode at each corner of each said polygon, the source region is offset a predetermined distance from the gate electrode, and in the source region extending along each side of each said polygon:

the width b of the source region extending over both inside and outside of a side of the source contact hole is longer than the width a of an inner end of the source region exposed to the source contact hole and extending along the said side of the contact hole, the width c of an outer end of the source region which confronts the gate electrode is longer than the width a of the inner end of the source region, and the width c of the outer end of the source region is longer than the width b of the source region.

The source region is separated by diagonal regions (isolation spacing 1 to 3 μm) of the quadrangle and each of the thus isolated source regions is trapezoidal in shape. Further, centrally of the base region is formed a well region having an impurity concentration higher than that of the base region and having a bottom deeper than that of the base region.

According to the above means (1):

(a) In each of the quartered trapezoidal source regions, the width c of an outer end of the source region which outer end corresponds to a base of the trapezoid is close to the gate electrode, while the width a of an inner end of the source region which inner end corresponds to an upper side of the trapezoid is exposed into the source contact hole, and thus the source region assumes a divergent shape in the flowing direction of drain current, so that the flow of drain current becomes smooth and ON resistance is decreased. That is, the source region is formed as a pattern wherein the width b of the source region is longer than the width a of the inner end of the source region, and the width c of the outer end of the source region is longer than the width b of the source region. Besides, since the isolation spacing between adjacent source regions is as narrow as 0.3 to 0.4 μm, the width of each source region can be set to a maximum value and ON resistance can be made small.

(b) Since there is adopted a structure wherein at each corner portion of the quadrangular cell the source region is not extended to below the gate electrode (gate insulating film), it follows that the source region is not formed in the short channel portion at each cell corner, so that the channel length practically becomes larger and leakage current is diminished.

(c) With the above (a) and (b), it is possible to provide a vertical high breakdown voltage MOSFET which permits a decrease of leakage current and of power loss. Further, yield is improved in manufacture by decrease of the leakage current, whereby it is possible to provide a high-quality product at low cost.

DETAILED DESCRIPTION OF THE PREFERRED EMBODIMENTS

Figure 1:
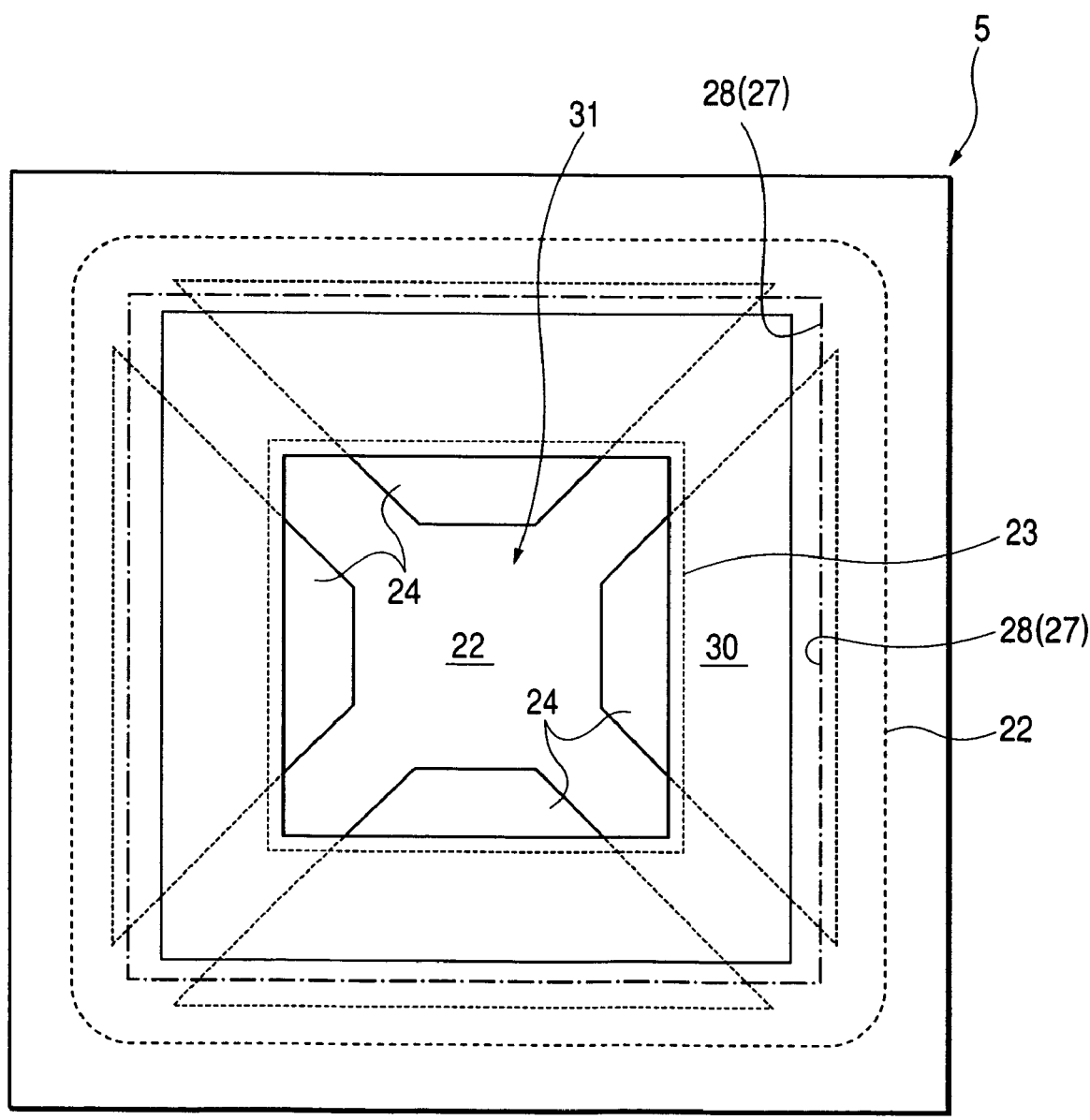
FIG. 1 is a schematic plan view showing a unit MOSFET (cell) portion of a vertical power MOSFET in a semiconductor element according to an embodiment (first embodiment) of the present invention.

Embodiments of the present invention will be described in detail hereinunder with reference to the accompanying drawings. In all of the drawings for illustrating the embodiments, components having the same functions are identified by the same reference numerals, and repeated explanations thereof will be omitted.

First Embodiment

Figure 5:
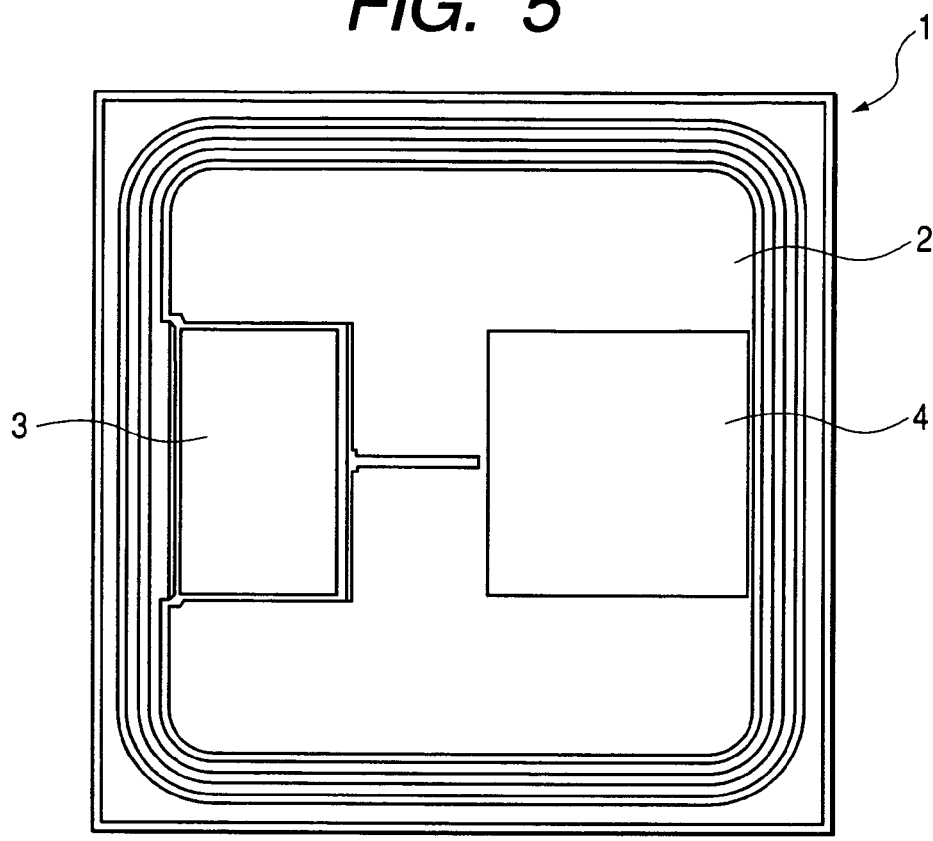
FIG. 5 is a schematic plan view of the semiconductor device of the first embodiment.

FIG. 5 is a schematic plan view of a semiconductor device (semiconductor chip) with a vertical insulated gate field effect transistor (vertical high breakdown voltage MOSFET) built therein according to an embodiment (first embodiment) of the present invention. As shown in FIG. 5, a semiconductor device 1 is of a flat structure having, for example, a length of 4.0 mm, a width of 4.0 mm and a thickness of 0.4 mm. The whole of an upper surface of the semiconductor device 1 serves as a MOS unit cell area 2, in which there are formed a gate pad (gate bonding area) 3 as an external electrode terminal and a source pad (source bonding area) 4. A field limiting area spreads outside the MOS unit cell area 2. A back side of the semiconductor device 1 serves as a drain electrode.

Figure 6:
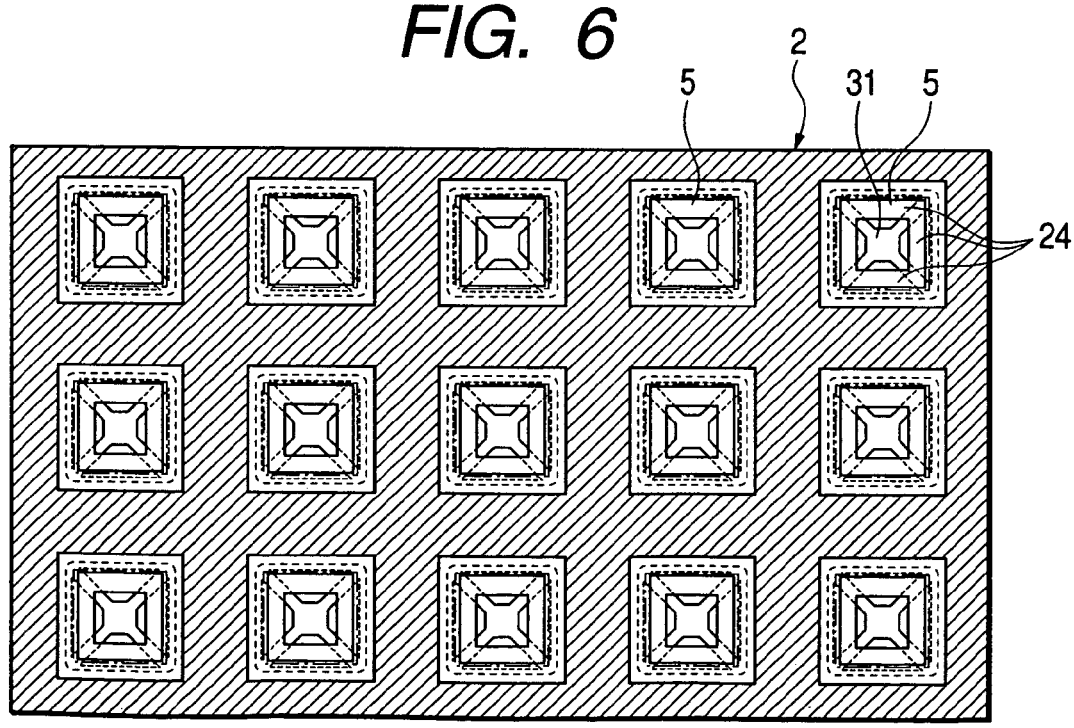
FIG. 6 is a schematic partial plan view showing a state of cell array in the semiconductor device of the first embodiment.

FIG. 6 is a schematic plan view showing the MOS unit cell area 2 partially. As shown in the same figure, unit MOSFETs (cells) 5 are arranged in order longitudinally and transversely. In the present invention the cells 5 are each formed in a polygonal shape. In this first embodiment a description will be given below of the case where the cells 5 are quadrangular.

Four adjacent cells 5 are arranged in a quadrangular shape in which centers of the cells 5 are positioned respectively at vertices of a quadrangle, which is a square in this embodiment. In this quadrangular array, the potential at a central part of the quadrangle in the quadrangular array based on depletion layers in the four adjacent cells is related by the depletion layers earlier than in a triangular array, so that there no longer occurs such an avalanche breakdown as in the triangular array and hence it is possible to set a breakdown voltage value as high as 1500V or so. It is also possible to freely select the breakdown voltage value in the range of 40 to 1500V in the design stage.

Figure 4:
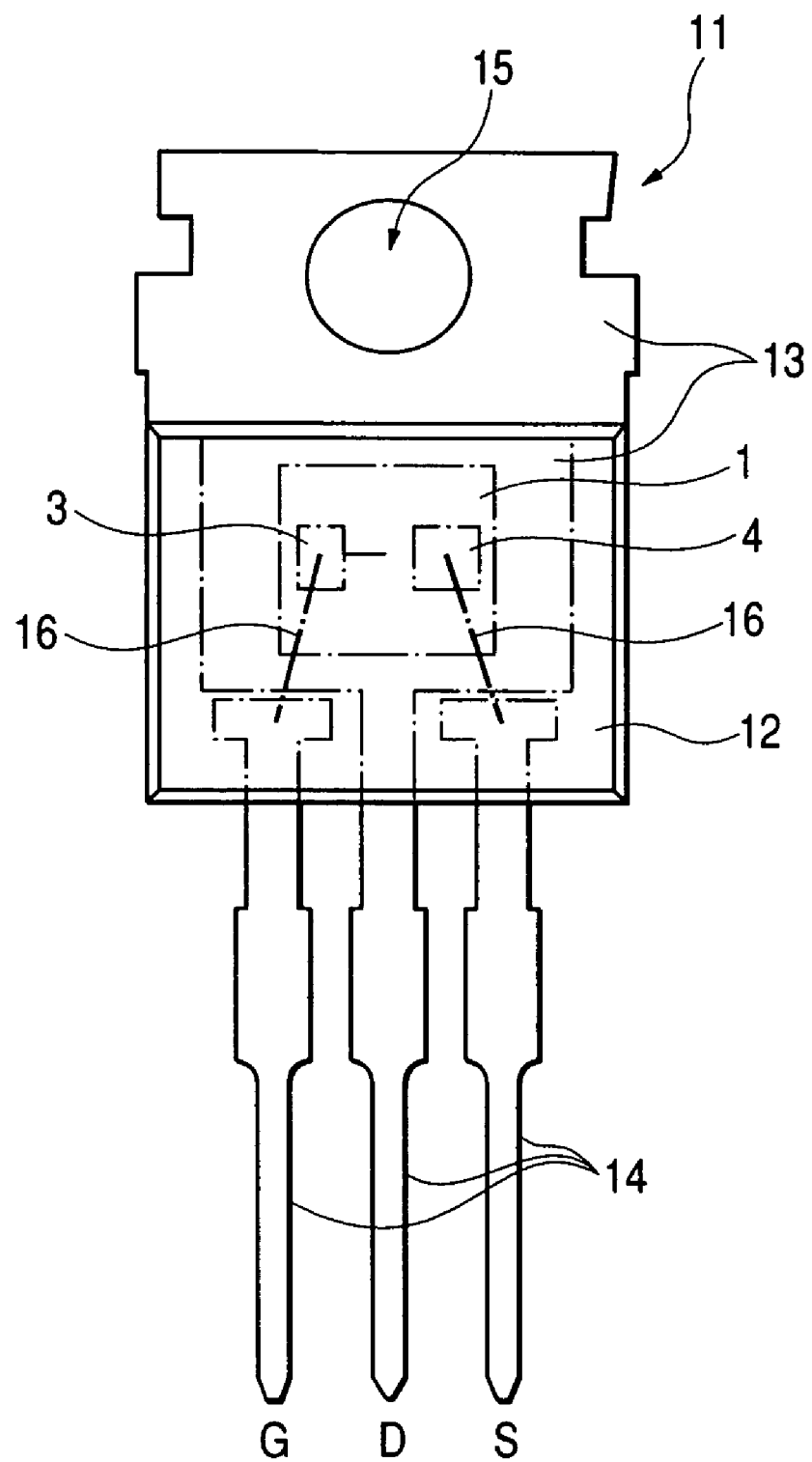
FIG. 4 is a plan view a semiconductor device with the semiconductor device of the first embodiment built therein.

The semiconductor device 1 constructed as above is incorporated into such a sealing member (package) 12 as shown in FIG. 4 to provide a semiconductor device 11. The semiconductor device 11 is made up the sealing member (package) 12 which in appearance is formed in a flat rectangular shape using an insulating resin, a header 13 projecting from one end of the sealing member 12, and three leads 14 projecting from an opposite end side of the sealing member 12. A lower surface (back side) of the header 13 is exposed to the back side of the sealing member 12, and a mounting hole 15 for use in mounting the semiconductor device 11 is formed in the header 13 projecting from the sealing member 12.

A part of the header 13 is buried in the sealing member 12, and the lead 14 located centrally is integral with the header 13, while the leads 14 located on both sides are separated from the header 13. For example, the left, center, and right leads 14 serve as gate (G), drain (D), and source (S), respectively. Within the sealing member 12, the semiconductor device 1 is fixed to an upper surface of the header 13 through the drain electrode. The gate pad 3 over the upper surface of the semiconductor device 1 and a tip portion of the left lead 14 serving as a gate are connected together through an electrically conductive wire 16. Likewise, the source pad 4 and a tip portion of the right lead 14 serving as a source are connected together through an electrically conductive wire 16.

The following description is now provided about the structure of each unit MOSFET (cell) 5 of the vertical high breakdown voltage MOSFET (vertical power MOSFET). FIG. 1 is a plan view of a cell portion, FIG. 2 is a sectional view of the cell portion, and FIG. 3 is a schematic plan view of the cell portion.

Figure 2:
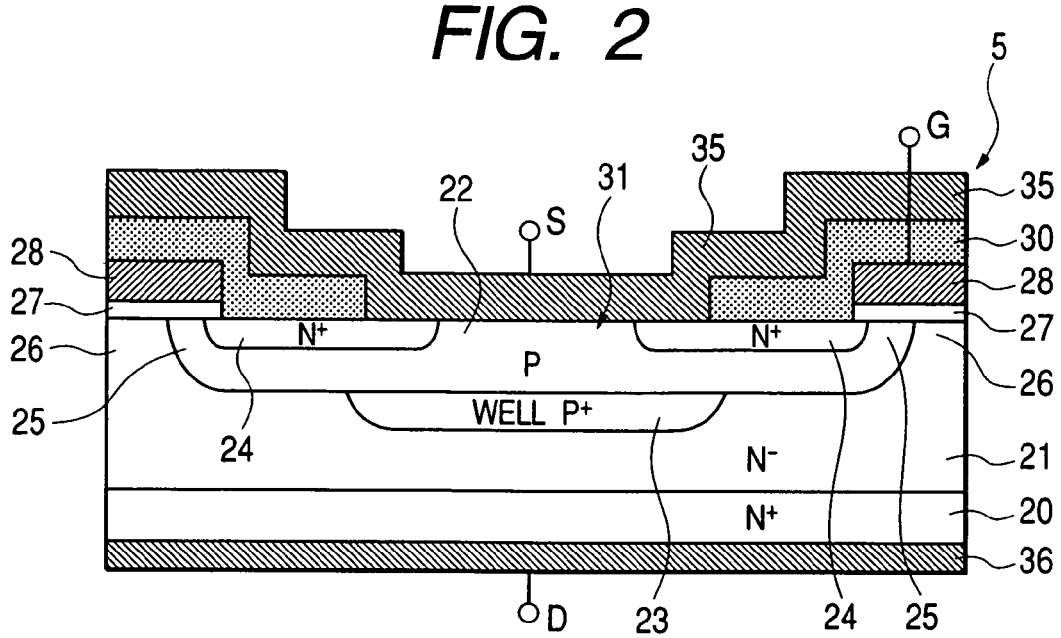
FIG. 2 is a schematic sectional view showing the cell portion.
Figure 3:
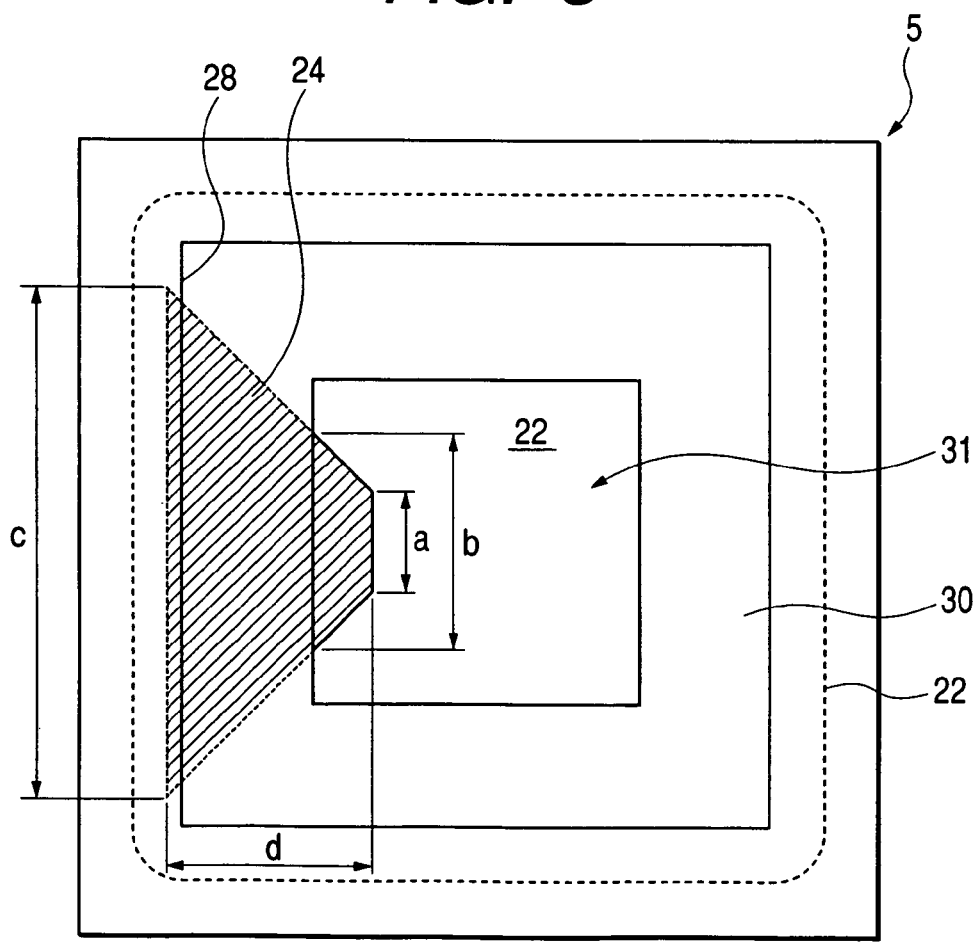
FIG. 3 is a schematic plan view showing a partial pattern of a source region in the cell portion.

As shown in FIG. 2, the cell 5 is formed over a main surface (upper surface) of a semiconductor substrate 20 made of $N^+$ type (first conductive type) silicon with an impurity concentration of about $10^{21}$ $cm^{-3}$ and a thickness of about 400 μm. More specifically, over the main surface of the semiconductor substrate 20 is formed an $N^-$ type (second conductive type) epitaxial layer 21 with an impurity concentration of about $10^{14}$ $cm^{-3}$ and a thickness of about 40 μm, and in a surface layer portion of the epitaxial layer 21 is formed a P type base region (channel-forming region) with an impurity concentration of about $10^{17}$ $cm^{-3}$ and a thickness of 3 μm. As indicated with a dotted line in FIG. 1, the base region 22 is generally square in plan and such base regions 22 are regularly provided longitudinally and transversely over the main surface of the semiconductor substrate 20. Centrally of the base region 22 is formed a $P^+$ type well region 23 with an impurity concentration of about $1\times10^{18}$ $cm^{-3}$. The well region 23 is formed at a depth of 5 to 7 μm from the surface of the semiconductor substrate.

Further, as shown in FIG. 1, inside a surface layer portion of the base region 22 are formed quartered, trapezoidal, $N^+$ type source regions 24. The source regions 24 each have an impurity concentration of about $10^{20}$ $cm^{-3}$ and a thickness of about 1 μm. Generally, in the case of a quadrangular cell, a source region is formed in the shape of a quadrangular frame. But in this first embodiment source regions are formed along diagonal lines of a quadrangle by a method wherein a mask is formed using a fine photoresist to prevent the diffusion of impurity. In this way there are formed trapezoidal source regions. Besides, since diffusion is performed at a mask width of 2 to 4 μm or so, an isolation spacing between adjacent source regions becomes 1 to 3 μm or so. With this width, corner portions of the quadrangle where the impurity concentration is non-uniform are not included in the source regions. In other words, the source regions 24 can be widened up to the vicinities of the corner portions of the quadrangle where the impurity concentration is not uniform, thus permitting a decrease of ON resistance.

The base region 22 and the well region 23 are formed by double diffusion. The surface layer portion of the base region 22 located between an outer periphery edge of each source region 24 and that of the base region 22 serves as a channel 25. The channel 25 is formed self-alignmentwise by a difference in the double diffusion. The epitaxial layer 21 deviated from the base region 22 and the well region 23, as well as the semiconductor substrate 20, constitute a drain region. A surface layer portion of the drain region, i.e., the portion between adjacent base regions 22, constitute a JFET portion 26.

On the other hand, a gate insulating film 27 having a thickness of about 50 to 130 nm is formed on all of the JFET portion 26, channel 25 and source region 24 close to the channel. Further, over the gate insulating film 27 is formed a gate electrode 28 using polysilicon (electric resistance: 20 to 30 Ω/□) at a thickness of about 300 to 500 nm. The gate insulating film 27 is formed using $SiO_2$ film.

The gate insulating film 27 and the gate electrode 28 are registered and overlap each other. The length of the source region 24 with the gate insulating film 27 superimposed thereon corresponds to the diffusion depth, for example, 0.5 µm or so, because the impurity diffusion mask for the source region 24 corresponds to the gate insulating film 27 and the gate electrode 28.

Further, an insulating film 30 is formed over the main surface side of the semiconductor substrate 20 exclusive of the quadrangular region which includes the center of the base region 22 and the inside portion of the source region 24 and which is analogous to the cell shape. For example, the insulating film 30 comprises $SiO_2$ film as a lower layer and PSG film (phosphosilicate glass film) which overlies the $SiO_2$ film.

The quadrangular region located centrally of the cell 5 and not provided with the insulating film 30 serves as a source contact hole 31. Upper portions of the trapezoids of the four trapezoidal source regions 24 are exposed to the interior of the source contact hole 31. Thus, the base region 22 and part of the source regions 24 are exposed into the source contact hole 31.

On the main surface side of the semiconductor substrate 20 is formed a source electrode 35. In the source contact hole 31 the source electrode 35 is connected electrically to the base region 22 and the source regions 24. On a back side (lower surface) of the semiconductor substrate 20 is formed a drain electrode 36, which is connected electrically to the $N^+$ type semiconductor substrate 20.

Though not shown, an insulating film is formed also on the source electrode 35, and the gate pad 3 and the source pad 4 both referred to previously are provided on the portion where the insulating film is not formed.

The following is a brief description of a method for fabricating such a unit MOSFET (cell) 5. First there is provided a semiconductor substrate 20 having an epitaxial layer 21 over a main surface thereof. Then, well regions 23 are formed in order longitudinally and transversely over the main surface side of the semiconductor substrate 20.

Next, an insulating film and a polysilicon layer are formed stackedly over the main surface of the semiconductor substrate 20. Thereafter, a gate insulating film 27 and a gate electrode 28 are formed in mesh (lattice) shape by the conventional photolithography technique and etching technique. The areas free of the gate insulating film 27 and the gate electrode 28 are quadrangular areas, which are arranged side by side in both longitudinal and transverse directions.

Then, with the gate electrode 28 as a mask, an impurity is diffused to form base regions 22.

Further, using as masks the gate electrode 28 and a photoresist film (not shown) which is provided selectively, an impurity is diffused to form source regions 24. The length of channel 25 is determined depending on the degree of diffusion in the source regions 24. In patterning the photoresist film prior to formation of the source regions, there is formed a fine photoresist layer (mask) along each diagonal line of the quadrangle. As a result, there are formed trapezoidal source regions 24.

FIG. 3 is a schematic plan view showing a source contact hole 31, a quadrangular portion not provided with the gate electrode 28, and a single source region 24. An upper side, or an inner end, of the source regions 24 as a trapezoidal region is exposed to the interior of the source contact hole 31. A lower side, or an outer end, of the trapezoid is positioned between an end of the gate electrode 28 and an outer periphery edge of the base region 22. Given that the width of the inner end of the source region is a, the width of the outer end of the source region is c, and the width of the source region 24 running along an edge of the source contact hole 31 (the width of the source region at an edge of the source contact hole) is b, the width b is longer than the width a, the width c is longer than the width a, and the width c is longer than the width b. That is, there exists a relationship of the width c of the outer end of the source region>the width b of the source region at a contact hole edge>the width a of the inner end of the source region. The height of the trapezoid is d. As an example, a is 4 µm, b is 8 µm, c is 18 µm, and d is 7 µm.

Next, an insulating film 30 is formed selectively over the main surface of the semiconductor substrate 20. At this time there are formed gate-source contact holes.

Subsequently, an aluminum layer is formed selectively, and a source electrode 35 is formed by the aluminum layer filled into the source contact hole, while gate wiring is formed by the aluminum layer filled into the gate contact hole. The gate wiring is electrically connected with the gate electrode 28 formed on the bottom of the gate contact hole.

Then, though not shown, a passivation film (insulating film) is formed selectively and there are formed a gate pad 3 and a source pad 4.

Next, a drain electrode 36 is formed on a back side of the semiconductor substrate 20.

Lastly, the semiconductor substrate 20 is cut longitudinally and transversely at predetermined positions to fabricate a larger number of semiconductor devices 1.

The following effects are obtained by this first embodiment.

(1) In each of the quartered, tapezoidal source regions 24, the width c of the outer end of the source region corresponding to the base of the trapezoid is close to the gate electrode 28, while the width a of the inner end of the source region corresponding to the upper side of the trapezoid is exposed to the interior of the source contact hole 31, and thus the source region is divergent in the flowing direction of drain current, so that the drain current flows smoothly and ON resistance can be decreased. That is, the source region 24 has a pattern wherein the width b of the source region (the width of the source region at a contact hole edge) is longer than the width a of the inner end of the source region, and the width c of the outer end of the source region is longer than the source region width b. Besides, the isolation spacing between adjacent source regions is as narrow as 0.3 to 0.4 μm. Therefore, the source region can be widened to a maximum extent and it is possible to decrease ON resistance.

Figure 7:
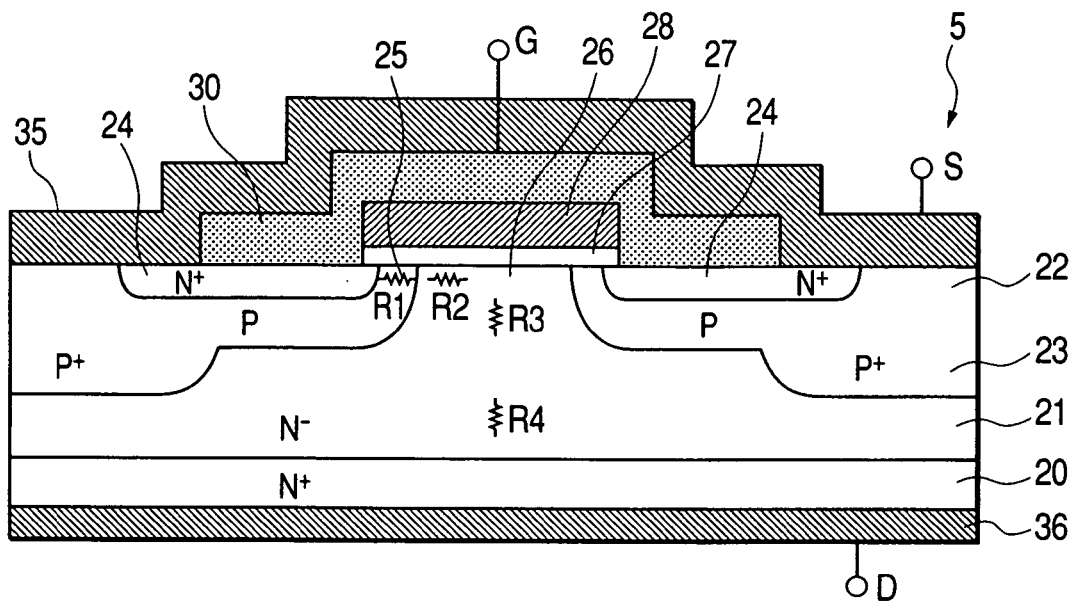
FIG. 7 is a schematic sectional view showing parasitic resistances of various portions in the semiconductor device.

FIG. 7 is a schematic sectional view schematically showing resistance components of ON resistance in cell 5. Channel resistance R1 is present in the channel 25 portion, surface resistance R2 is present in JFET portion 26, and spreading resistance (JFET resistance) R3 and drift resistance R4 are present in the depth direction of the JFET portion 26.

In this first embodiment, since leakage current is decreased without enlarging the channel length of MOSFET, the channel resistance R1 as a component of ON resistance is not made large, nor is narrowed the JFET portion 26, and hence the spreading resistance (JFET resistance) R3 does not become large, whereby it is possible to decrease ON resistance.

(2) Since there is adopted a structure wherein at each corner of the quadrangular cell the source region 24 is not extended to below the gate electrode 28 (gate insulating film 27), the source region is not formed in the short channel portion at each cell corner, so that the channel length becomes larger practically and leakage current is diminished.

Figure 8:
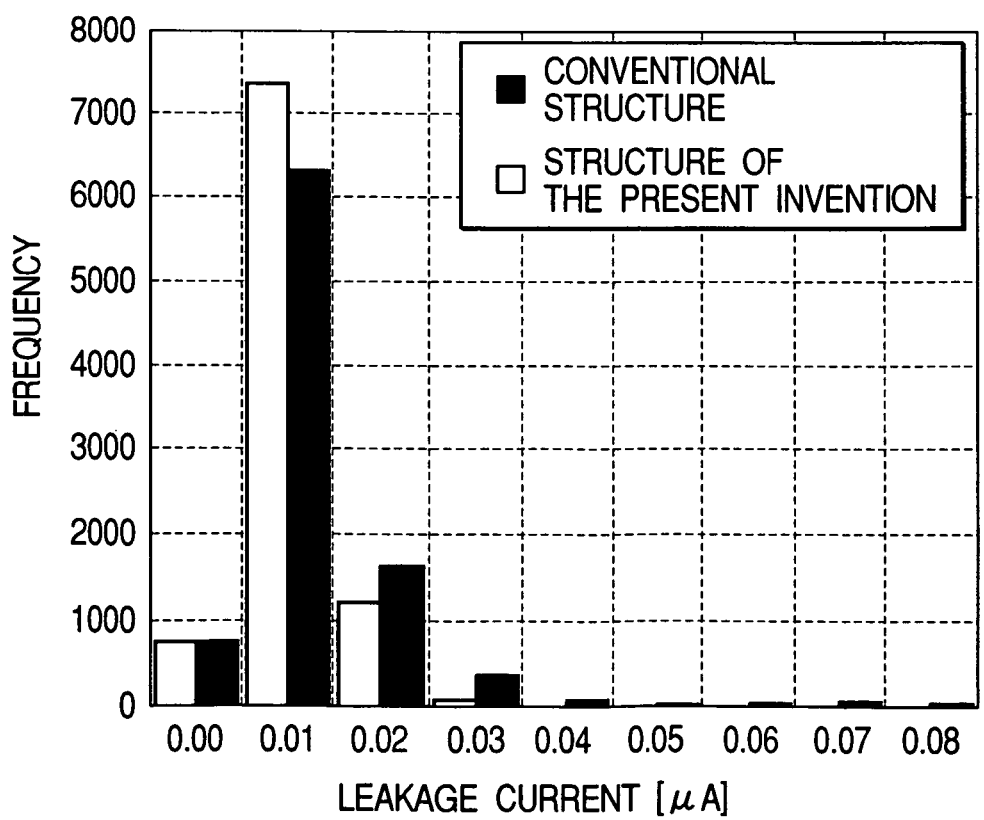
FIG. 8 is a graph showing a correlation between leakage current of MOSFET and frequency thereof in the semiconductor device of the first embodiment.

FIG. 8 is a graph showing a leakage current frequency distribution based on the results of having measured about 10,000 semiconductor devices. The output of each semiconductor device is 450 mW and the number of square cells is about 25,000.

In the conventional structure wherein a cell is centrally formed with a quadrangular source contact hole and a source region, which extends along the source contact hole, is in the shape of a quadrangular frame, leakage current peaks at 0.01 μA, in which the number of samples is about 7400 pieces. Likewise, the number of samples is about 1800 pieces at a leakage current of 0.02 μA, about 400 pieces at 0.03 μA, and about 100 at 0.04 μA. Leakage current occurs up to 0.05 to 0.08 μA although the number of samples is smaller than 100 pieces.

On the other hand, in the structure using four independent trapezoidal source regions according to the present invention, the peak of leakage current is the same as in the conventional structure, i.e., 0.01 μA, but the number of samples (frequency) at that peak is 6300 pieces and is thus smaller. About 1150 pieces and about 100 pieces appear at leakage currents of 0.02 μA and 0.03 μA, respectively, but at 0.04 μm and more there is no leakage current.

Thus, according to the vertical high breakdown voltage MOSFET according to this first embodiment, not only it is possible to decrease the loss of power but also the breakage of device becomes difficult to occur.

According to experimental data, in the conventional 450V-proof MOSFET using a quadrangular frame-like source region, a mean value of leakage current is 137 nA, while in the power MOSFET of this first embodiment a mean value of leakage current is 81 nA, which is about 59% of the above mean value, corresponding approximately to a reduction by half.

(3) With the above effects (1) and (2) it is possible to provide a vertical high breakdown voltage MOSFET which permits a decrease of leakage current and which is small in power loss.

(4) Moreover, since leakage current is thus diminished, it is possible to improve the manufacturing yield and provide a vertical high breakdown voltage MOSFET of a high quality in a less expensive manner.

Second Embodiment

Figure 9:
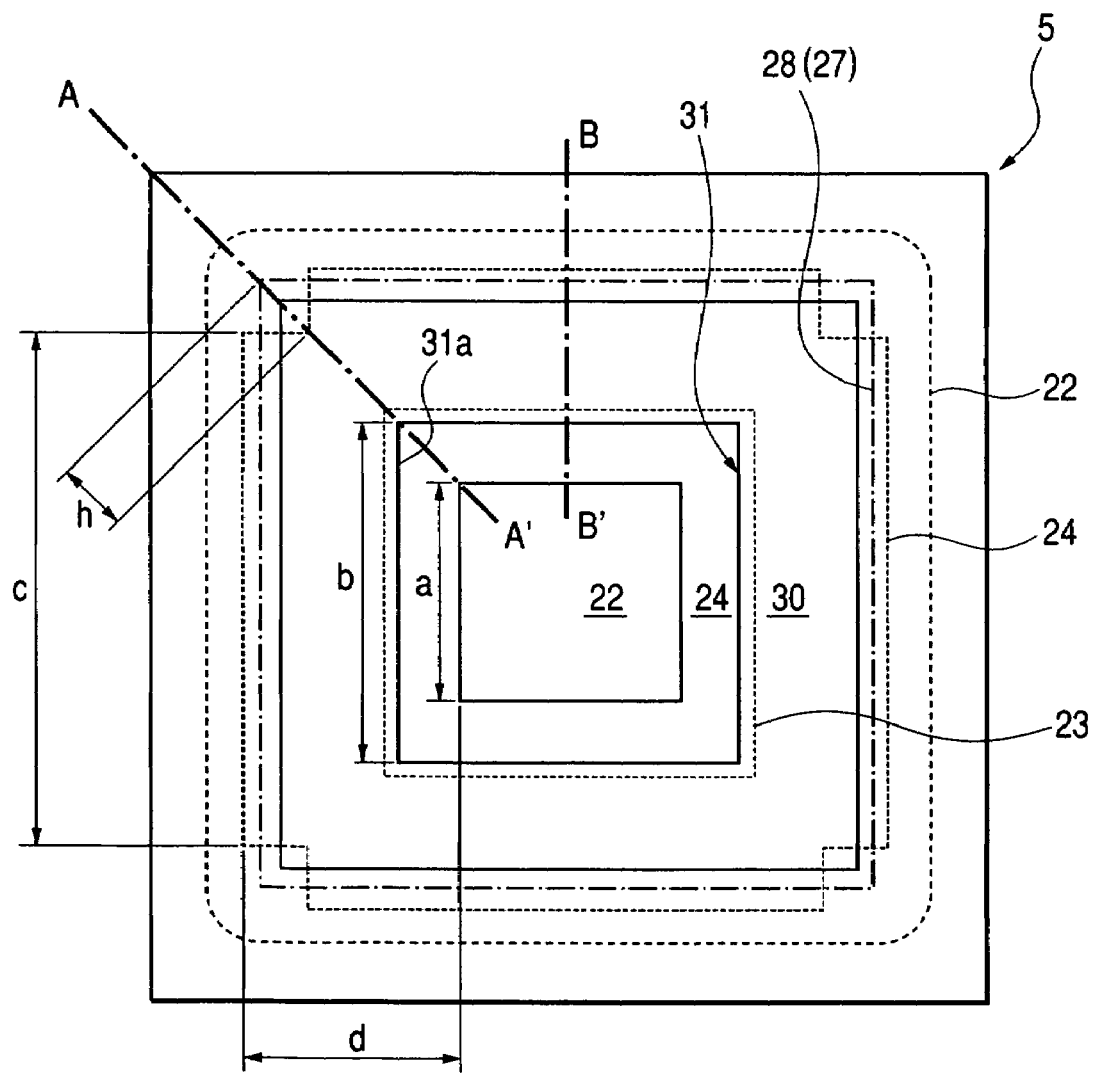
FIG. 9 is a schematic plan view showing a vertical power MOSFET portion according to another embodiment (second embodiment) of the present invention.
Figure 10A:
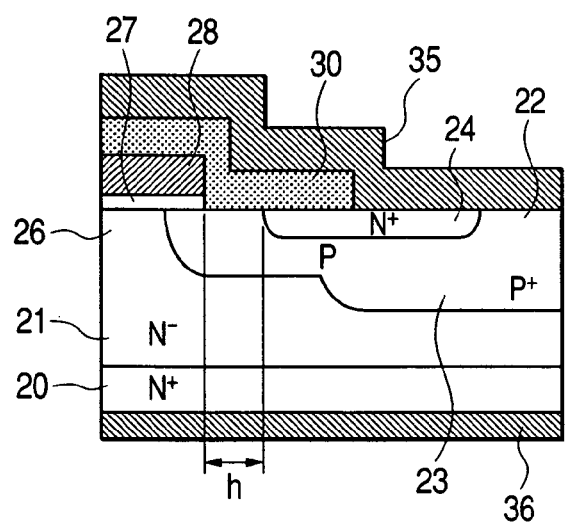
FIG. 10 is a sectional view taken along lines A-A' and B-B' in FIG. 9.
Figure 10B:
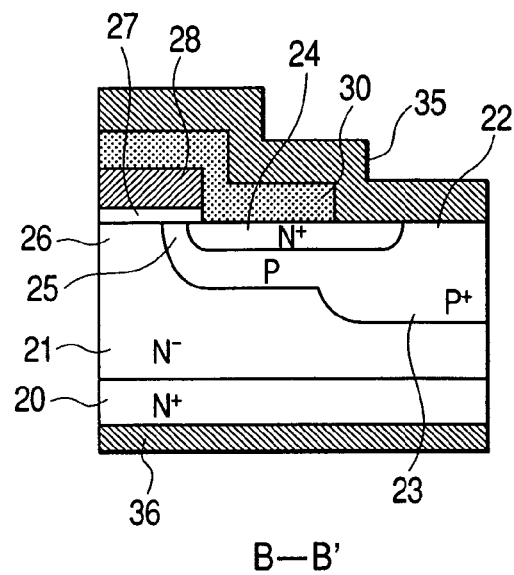
Figure 11:
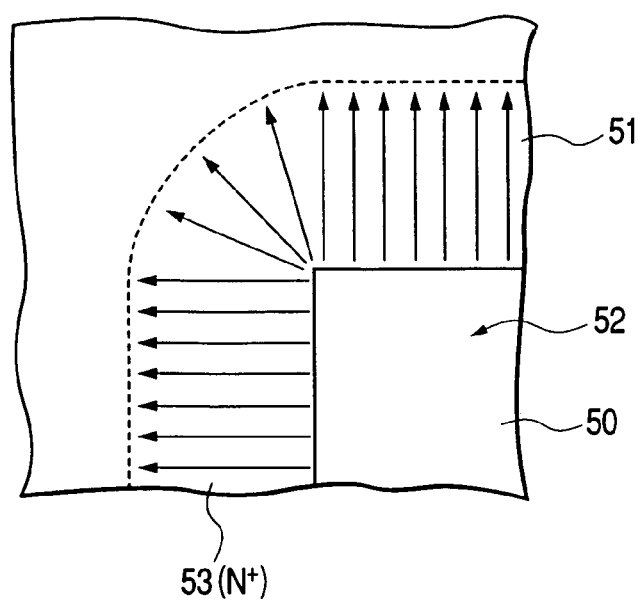
FIG. 11 is a schematic diagram showing a state of impurity diffusion at a corner portion below a mask which has a quadrangular opening.

FIG. 9 is a schematic plan view showing a vertical power MOSFET portion according to a further embodiment (second embodiment) of the present invention and FIGS. 10(a) and 10(b) are sectional views taken along lines A-A' and B-B' in FIG. 9.

In this second embodiment, in a unit MOSFET (cell) 5, a source region 24 is formed as a quadrangular frame pattern extending along a source contact hole 31, but at the corners of a quadrangular cell the impurity concentration is not uniform and the channel length is short, so at the corner portions the source region 24 is not provided. FIG. 10(b) is a sectional view taken along line B-B' in FIG. 9. In the same figure, the source region 24 extends up to below a gate insulating film 27 and a gate electrode 28 and a channel 25 is formed. FIG. 10(a) is a sectional view taken along line A-A' in FIG. 9, showing a portion corresponding to a corner of a quadrangular cell. As shown in the same figure, an outer end portion of the source region 24 is not positioned below the gate insulating film 27 and the gate electrode 28, but is offset therefrom at a distance of h. Thus, like the previous first embodiment, there is adopted a structure wherein at each corner of the quadrangular cell the source region 24 is not extended to below the gate electrode 28 (the gate insulating film 27). It follows that the source region is not formed at the short channel portion of each cell corner. Consequently, the channel length becomes longer practically and hence leakage current is diminished.

Also in this second embodiment, as to the portion of the source region 24 extending along each side of the source contact hole 31, there is a tendency that the source region 24 has the same width size relation as in the first embodiment. More specifically, a study will now be made about the portion of the source region 24 which extends over inside and outside of a left side of the source contact hole 31 in FIG. 9. The length b of the portion of the source region 24 extending along a left side 31a of the source contact hole 31 (the width b of the source region at a contact hole edge) is larger than the width a of an inner end of the source region exposed to the interior of the source contact hole 31, and the width c of an outer end of the source region close to the gate electrode 28 is longer than the width a of the inner end of the source region. The widths a, b, and c are in the relationship of c>b>a.

By using the unit MOSFET (cell) 5 according to this second embodiment there is obtained, in addition to the effects of the first embodiment, an effect that the resistance of contact with the source electrode 35 can be made still smaller because there is adopted an integral structure (single pattern) wherein the source region 24 exposed to the interior of the source contact hole 31 is a continuous, quadrangular frame-like region.

Although the present invention has been described above concretely by way of embodiments thereof, it goes without saying that the present invention is not limited to the embodiments, but that various changes may be made within the scope not departing from the gist of the invention.

The following is a brief description of effects obtained by typical modes of the invention disclosed herein.

(1) It is possible to diminish ON resistance of a vertical, high breakdown voltage MOSFET.

(2) It is possible to diminish leakage current of a vertical high breakdown voltage MOSFET.

(3) In a vertical high breakdown voltage MOSFET, it is possible to suppress power loss because leakage current and ON resistance can be diminished.

(4) Since leakage current is diminished, it is possible to fabricate a vertical high breakdown voltage MOSFET of a high quality in a less expensive manner.

What is claimed is:

1. A semiconductor device having a plurality of polygonal-shaped unit MOSFET cells connected in parallel disposed on a main surface of a semiconductor substrate, each unit MOSFET cell comprising:
    a gate insulating film formed on the main surface of the semiconductor substrate;
    a gate electrode formed on the gate insulating film, the gate electrode being positioned above the main surface of the semiconductor substrate;
    a drain region formed in the semiconductor substrate;
    a drain electrode formed on a back surface of the semiconductor substrate, and electrically connected with the drain region;
    a channel region formed over the drain region; and
    a plurality of source regions which are discrete from each other and formed over the channel region.

2. A semiconductor device according to claim 1, wherein the polygonal-shaped unit MOSFET cell has a quadrangle shape and four of said source regions.

3. A semiconductor device according to claim 2, wherein each of the source regions has trapezoidal shape in a plan view.

4. A semiconductor device according to claim 3, wherein the four source regions are separated by diagonal regions of the polygonal-shaped unit MOSFET cell.

5. A semiconductor device according to claim 1, further comprising:
    an insulating film formed over the gate electrode and source regions;
    a contact hole formed in the insulating film, and exposing a part of each of the plurality of source regions; and
    a source electrode formed over the insulating film, wherein the plurality of source regions are electrically connected to the source electrode via the contact hole.

6. A semiconductor device according to claim 1, wherein the plurality of the source regions are surrounded by the gate electrode in a plan view.

7. A semiconductor device according to claim 1, wherein the plurality of polygonal-shaped unit MOSFET cells comprise a power MOSFET.

8. A semiconductor device according to claim 1, wherein the MOSFET is a planar gate type MOSFET.

9. A semiconductor device having a plurality of quadrangle-shaped unit MOSFET cells connected in parallel disposed over a main surface of an epitaxial layer, the epitaxial layer being formed over a semiconductor substrate, and each unit MOSFET cell comprising:
    a gate insulating film formed over the main surface of the epitaxial layer;
    a gate electrode formed over the gate insulating film, the gate electrode being positioned above the main surface of the epitaxial layer;
    a drain region formed in the epitaxial layer;
    a drain electrode formed on a back surface of the semiconductor substrate, and electrically connected with the drain region; and
    four source regions which are discrete from each other and formed over a channel region,
    wherein each of the source regions has trapezoidal shape in a plan view.

10. A semiconductor device according to claim 9, wherein the MOSFET is a planar gate type MOSFET.

11. A semiconductor device according to claim 9, wherein the four source regions are separated by diagonal regions of the quadrangle-shaped unit MOSFET cell.

12. A semiconductor device according to claim 9, further comprising:
    an insulating film formed over the gate electrode and source regions;
    a contact hole formed in the insulating film, and exposing a part of each of the source regions; and
    a source electrode formed over the insulating film,
    wherein the source regions are electrically connected to the source electrode via the contact hole.

13. A semiconductor device according to claim 9, wherein the source regions are surrounded by the gate electrode in plan view.

14. A semiconductor device according to claim 9, wherein the plurality of unit MOSFET cells comprise a power MOSFET.

* * * * *

UNITED STATES PATENT AND TRADEMARK OFFICE
CERTIFICATE OF CORRECTION

PATENT NO. : 7,312,501 B2
APPLICATION NO. : 11/030094
DATED : December 25, 2007
INVENTOR(S) : Katsuo Ishizaka and Tetsuo Iijima It is certified that error appears in the above-identified patent and that said Letters Patent is hereby corrected as shown below:

On the title page, item (75), the listing of inventors should read as follows:

(75) Inventors: Katsuo Ishizaka, Shinto (JP); Tetsuo Iijima, Maebashi (JP)

Signed and Sealed this

Second Day of September, 2008

JON W. DUDAS
*Director of the United States Patent and Trademark Office*